(12) United States Patent
Belyansky et al.

(10) Patent No.: US 6,967,137 B2
(45) Date of Patent: Nov. 22, 2005

(54) FORMING COLLAR STRUCTURES IN DEEP TRENCH CAPACITORS WITH THERMALLY STABLE FILLER MATERIAL

(75) Inventors: Michael P. Belyansky, Bethel, CT (US); Rama Divakaruni, Ossining, NY (US); Jack A. Mandelman, Flat Rock, NC (US); Dae-Gyu Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 10/604,255

(22) Filed: Jul. 7, 2003

(65) Prior Publication Data

US 2005/0009267 A1 Jan. 13, 2005

(51) Int. Cl.[7] .......................................... H01L 21/8242
(52) U.S. Cl. ...................................... 438/246; 438/389
(58) Field of Search ............................... 438/242, 243, 438/244, 246, 247, 249, 386, 387, 389, 390, 392

(56) References Cited

U.S. PATENT DOCUMENTS

| | | | | |
|---|---|---|---|---|
| 6,008,104 A | * | 12/1999 | Schrems | 438/386 |
| 6,025,245 A | * | 2/2000 | Wei | 438/386 |
| 6,271,079 B1 | * | 8/2001 | Wei et al. | 438/243 |
| 6,271,142 B1 | | 8/2001 | Gruenign et al. | |
| 6,329,698 B1 | * | 12/2001 | Koscielniak et al. | 257/565 |
| 6,670,235 B1 | * | 12/2003 | Tews et al. | 438/246 |
| 6,770,563 B2 | * | 8/2004 | Huang et al. | 438/702 |
| 2002/0014647 A1 | * | 2/2002 | Seidl et al. | 257/301 |
| 2002/0036310 A1 | * | 3/2002 | Lutzen | 257/301 |
| 2003/0045068 A1 | * | 3/2003 | Gutsche et al. | 438/386 |
| 2005/0009268 A1 | * | 1/2005 | Cheng et al. | 438/249 |

* cited by examiner

*Primary Examiner*—Stephen W. Smoot
(74) *Attorney, Agent, or Firm*—Belinda Lee

(57) ABSTRACT

In the course of forming the collar dielectric in a DRAM cell having a deep trench capacitor, a number of filling and stripping steps required in the prior art are eliminated by the use of a spin-on material that can withstand the high temperatures required in front-end processing and also provide satisfactory filling ability and etch resistance. The use of atomic layer deposition for the formation of the collar dielectric reduces the need for a high temperature anneal of the fill material and reduces the amount of outgassing or cracking.

20 Claims, 4 Drawing Sheets

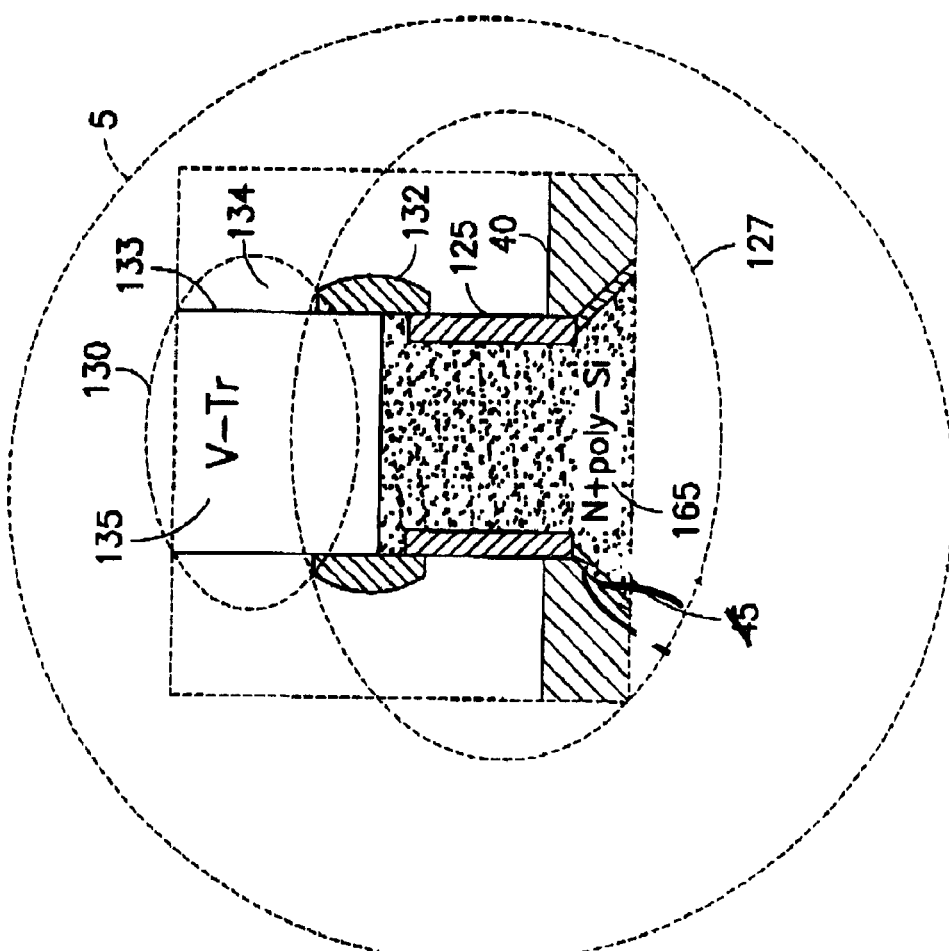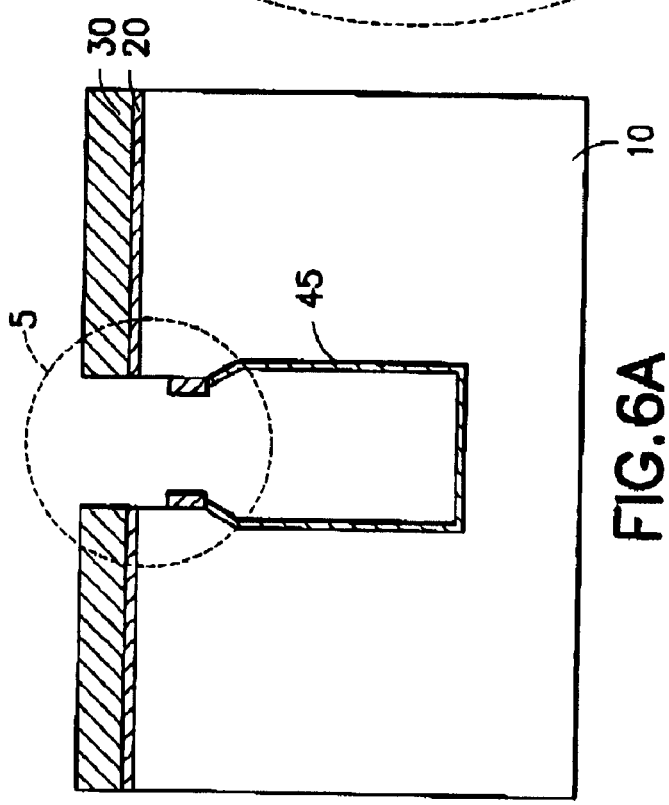

FORMING COLLAR STRUCTURES IN DEEP TRENCH CAPACITORS WITH THERMALLY STABLE FILLER MATERIAL

BACKGROUND OF INVENTION

The field of the invention is that of forming DRAM cells having high aspect ratio trenches in integrated circuit processing.

As ground rule dimensions shrink in integrated circuits, the problem of filling high aspect ratio trenches increases, in particular for trench capacitors used in DRAM cells that are commonly used in advanced processing.

The industry-standard filling process has been photoresist, applied and stripped several times. This method has been widely adopted because photoresist is well understood.

Since resist cannot stand the high temperatures used in front end processing, it is necessary to strip the resist and refill the trench when a step is to be performed at a temperature greater than 300 C. This occurs more than once in the course of the deep trench processing module.

As an additional consideration, the lengthy processes required to fabricate an integrated circuit are currently highly integrated; i.e. a change in a single process step can affect the result of steps performed before and after it, sometimes affecting steps that are not immediately before or after, but separated in time by several other steps.

It is therefore a multi-dimensional or multi-factor decision to change a process step. It is not enough that the new step produce a tougher, or thinner, or lower-density film, or take less time to put down. It is also required that the new step not produce disadvantages in other aspects of the process that outweigh the benefits.

The steps in a typical prior art method up to forming the buried plate of the trench capacitor are a) etching a deep trench in a silicon substrate; b) forming a barrier layer on a trench sidewall; c) filling the trench with photoresist; d) recessing (etching) the photoresist to a pre-determined depth, so a top part of deep trench is exposed; e) removing the barrier layer in the upper region to expose the trench sidewall; f) stripping the photoresist; g) forming a collar on the side wall upper portion using the barrier layer as a mask in the lower portion; and h) forming a buried plate diffusion region in the trench lower region using the collar as a mask for the upper portion.

The main function of the barrier material in the prior art method is to protect the lower portion of the trench during the steps of forming the collar.

The barrier material is typically nitride or a composite of oxide and nitride.

This is a fairly complicated and expensive process and it would be highly desirable to have a process with fewer and/or less expensive steps that produced an equivalent result.

In a particular prior art example, shown in U.S. Pat. No. 6,271,142, the method uses a partial fill scheme of deep trenches with spin-on material that is immediately followed by a collar formation. Partial fill of deep trenches has a very high non-uniformity of SOG (the reference point is thickness of SOG material at deep trench bottom—thousands of Angstroms). This approach can not be implemented in manufacturing. Partial fill requires an ideal structure with all Deep Trenches being of identical size since SOG thickness is proportional to trench volume. This method can not fill trenches of different sizes and volumes, which is typical for any real DRAM device. The patent also does not address the problem of final removal of SOG from the wafer surface, since it does not use any etch or CMP techniques.

SOG has a tendency to outgas and/or to crack or delaminate as a result of thermal stress. The probability of cracking is dependent on the thickness of the layer and also on the density of the pattern and topology. Those skilled in the art have been reluctant to use SOG as a trench filler because of the cracking problem and the difficulty of predicting what thickness is safe to use.

SUMMARY OF INVENTION

The invention relates to a simplified process for forming a deep trench capacitor up to the formation of the buried plate that eliminates the deposition and removal of the barrier material.

A feature of the invention is the use of a Low cost, temperature stable spin-on material as a sacrificial material instead of photoresist.

Another feature of the invention is the elimination of some steps in the creation of a collar structure on a deep trench sidewall.

Another feature of the invention is the use of atomic layer deposition (ALD) for collar deposition.

ALD has an advantage of producing high quality materials (such as SiN and SiO2) at a relatively low temperature range (250–650 C). The benefits of lowering the temperature budget of deposition are described in detail below. The process comprises the following basic steps:

a) formation of a deep trench in a silicon substrate; filling the trench with temperature stable spin-on material;

Optional anneal of spin-on material to higher temperature is recommended preferably matching the temperature of subsequent collar deposition;

b) Recess (etch) the spin-on material to a pre-determined depth so the top part of deep trench is exposed;

As an alternative chemical mechanical polish (CMP) of spin-on material could be used if necessary before recess to improve recess uniformity;

c) Form a collar on deep trench sidewall upper portion;

d) Remove the spin-on material from trench bottom by a wet etch; and e) Form a buried plate in the trench lower region.

As described above, an essential consideration of the decision to introduce a new process is whether its advantages, e.g. lower cost, outweigh its disadvantages.

While additional SOG anneal and CMP steps could add to process cost, these steps are typically are less expensive than resist reactive ion etching (RIE) steps. Cost of spin-on material is also typically much less than CVD type of materials. The greater advantage of the proposed scheme in its flexibility, since its eliminating temperature budget restrictions of resist based schemes.

The spin-on material has a molecular weight of between 1,000 and 10,000. It is applied as dissolved in a solvent for the spin-on step. The solvent is driven off in a pre-bake step at relatively low temperature (less than about 350 degC.) and the material is cured by heating in various ambients.

The identified temperature stable spin-on material is poly-silazane, which has excellent gap filling properties and was shown to fill deep trenches with aspect ratio of 40–60. The material has a structural formula of [SiNR1R2NR3]n, where R1, R2 and R3 are all hydrogen in the case of inorganic poly-silazane and are alkyl, aryl, or alkoxyl organic radicals in organic poly-silazane. For convenience, the term polysilazane will be shortened to silazane.

BRIEF DESCRIPTION OF DRAWINGS

FIGS. 6A and 6B illustrate a potential parasitic transistor.

DETAILED DESCRIPTION

Figure 1:
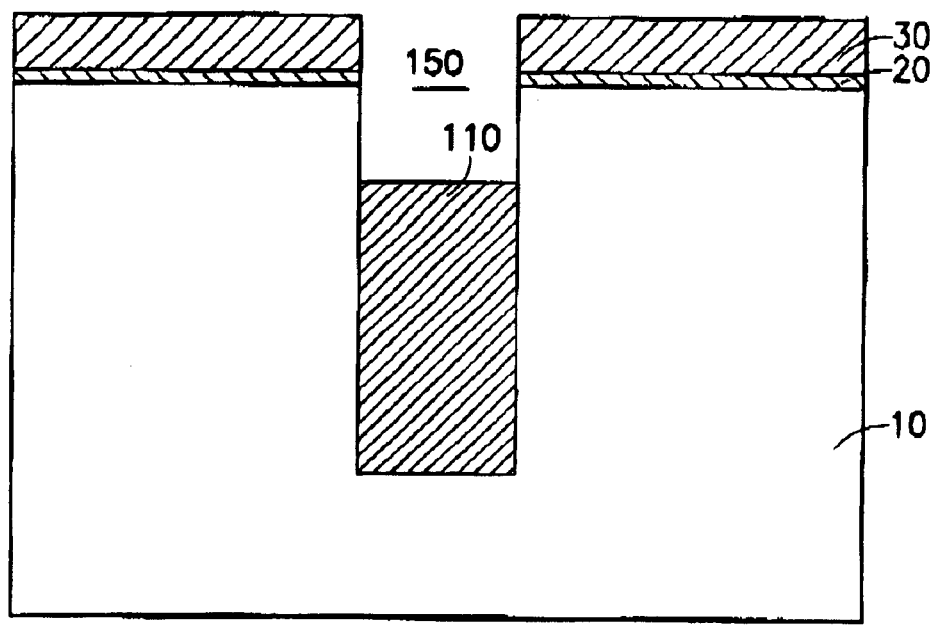
FIG. 1 illustrates a section of a silicon wafer after preliminary steps in the formation of a trench capacitor.

FIG. 1 illustrates a portion of a silicon wafer 10 after a number of preliminary steps including forming pad oxide 20, pad nitride 30, forming a deep trench (nominally about 8 microns deep and having an aspect ratio of greater than 40) in a conventional reactive ion etch step, filling the trench with a temporary filler material iiQ, illustratively spin-on glass (SOG) and recessing the SOG to provide room for forming a dielectric collar. A conventional planarizing step, e.g. by chemical-mechanical polishing, may be performed at any convenient time.

An anneal step is performed after filling the trenches with SOG (or after SOG CMP). For polysilazane, an oxidizing anneal ambient is preferred. Preferably, the temperature of the anneal is relatively close to the temperature of collar material deposition in order to prevent excessive SOG outgassing during deposition. Such an anneal/cure can be done in-situ in the spin-on track (the tool used for spin-on application) during the spin-on application if the deposition has a low temperature budget of less than 500 C (such as ALD).

Figure 2:
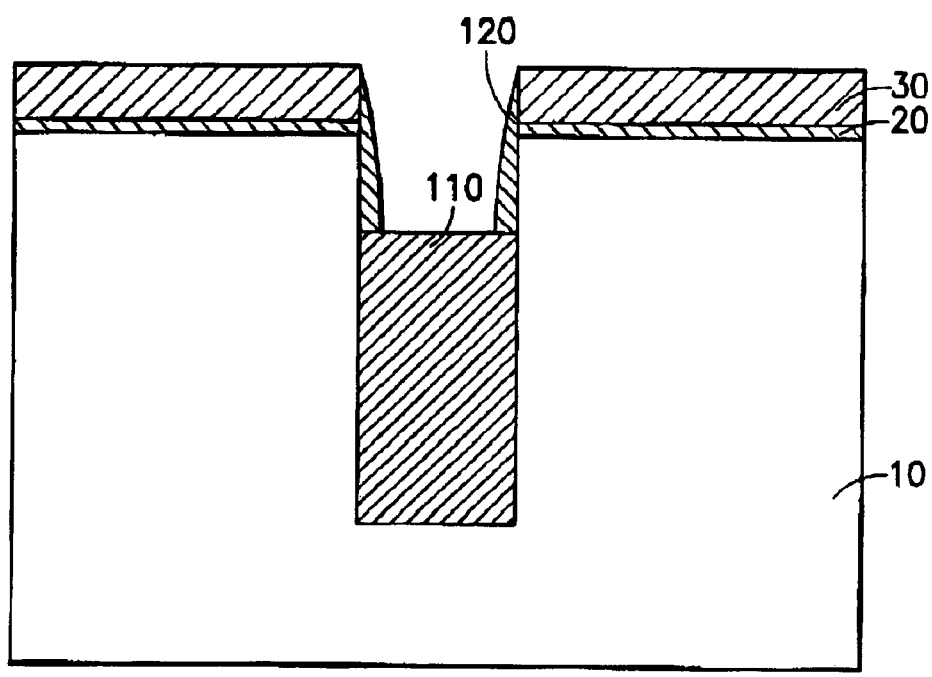
FIG. 2 illustrates the same section after depositing a liner according to the invention.

FIG. 2 shows the result of forming a spacer 120 as discussed below. According to the invention, a nitride layer is deposited using atomic layer deposition (ALD), which is performed at low temperature, e.g. 250–650 C.

The low temperature deposition is an advantage, because SOG has a tendency to outgas and/or to crack or delaminate as a result of thermal stress. The probability of cracking is dependent on the thickness of the layer and also on the density of the pattern and topology. Those skilled in the art have been reluctant to use SOG as a trench filler because of the cracking problem and the difficulty of predicting what thickness is safe to use. Also, since the wet etch rate of polysilazane based spin-on material decreases with an increase in anneal temperature, it becomes important to keep the temperature budget of SOG as low as possible. SOG annealed at lower temperature (<650 C) is much easier to remove from the trench bottom than SOG annealed at a temperature greater than about 700 C. Therefore, low temperature ALD deposition of collar material can provide a pathway for further improvement in process time and throughput due to significantly reduced SOG etch removal times.

With an ALD deposition according to the invention, the amount of outgassing, probability of cracking or delamination and SOG etch times are much reduced.

Figure 3:
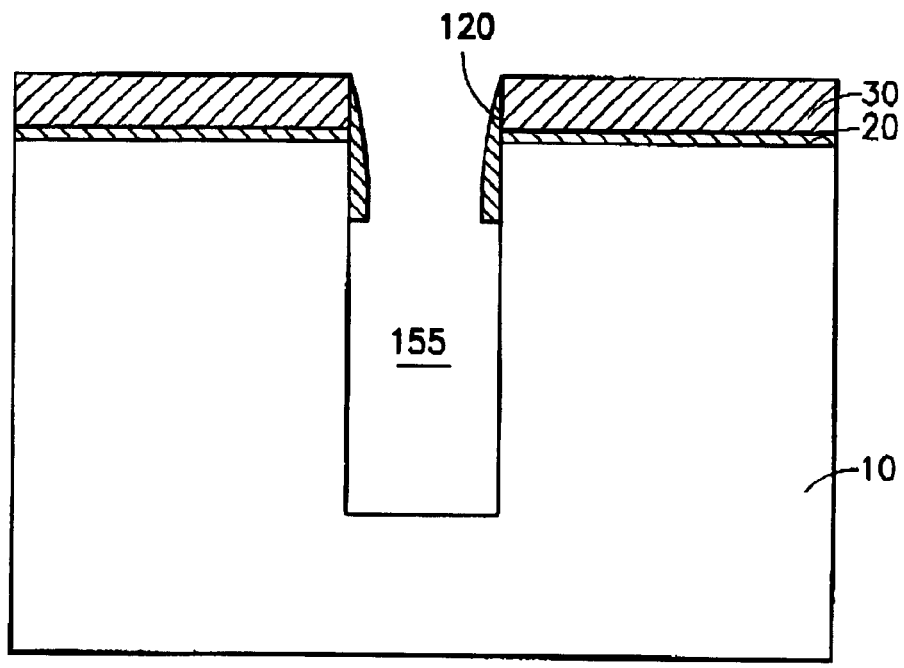
FIG. 3 illustrates the same section after stripping the temporary filler in the lower portion of the trench.
Figure 4:
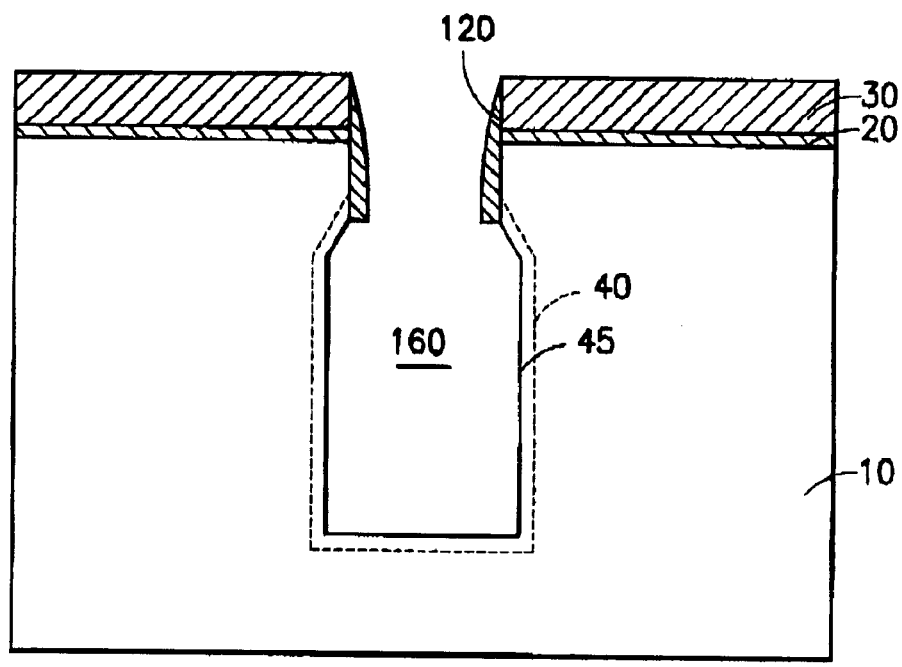
FIG. 4 illustrates the same section after widening the lower portion of the trench.

After the spacer material has been put down and the material on the bottom of the aperture 150 has been etched to form the spacer itself, the SOG material is removed, e.g. in a wet etch process, as shown in FIG. 3, leaving the entire depth of the trench, shown as aperture 155, ready for doping the buried plate 40, e.g. by gas phase doping shown in FIG. 4 with capacitor dielectric 45 and buried plate 40. Further steps of depositing the node dielectric and filling the trench with the center electrode to complete the capacitor.

Figure 5:
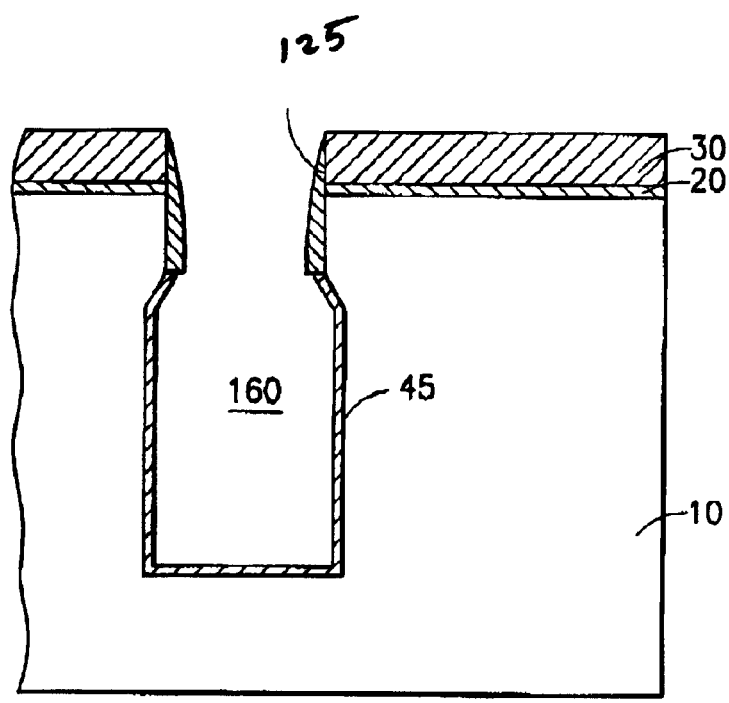
FIG. 5 illustrates the same section after deposition of an alternative collar material.

In another aspect of the invention, a conventional process of depositing low pressure nitride may be used for the spacers, as shown in FIG. 5. In that case, the SOG is a thermally stable material, e.g. polysilazane, that is cured at a temperature of less than 450C and then annealed, either in an oxygen ambient or in an ambient containing water vapor, at a relatively high temperature of 700–1200 C. Inert ambient anneal typically produces high tensile stress in SOG and could cause cracking. With annealing, the SOG can withstand the deposition temperature of LP nitride (600–800C), which provides a considerable advantage and process simplification over the prior art of a resist fill. The FIG. 4 shows the result after stripping the temporary filler material, leaving the aperture 160 (in this case having been extended in a bottle etch step), with a capacitor dielectric 45 and spacers 120. This step of performing the bottle etch precedes the step of depositing a thermally stable filler material.

In another aspect of the invention, the collar is made of a high-k material, meaning Al2O3, HfO2, ZrO2 and La2O3 and their silicides; and the like. The preferred deposition method for these materials is also ALD, with its low temperature. The low temperature deposition process is considered advantageous, since it exerts less thermal stress in SOG.

FIG. 6A shows an overall view of a trench after a "bottle etch" step of widening the aperture that will hold the capacitor and showing in detail 5 the location of a possible parasitic FET. In FIG. 6B, dotted oval 130 denotes schematically the vertical cell transistor, with gate 135, gate dielectric 133, body 134, and lower electrode/buried strap 132. The dotted oval 127 encloses an area extending from the buried plate 40 of the capacitor to the buried strap 132 of the vertical transistor 130. When the voltage on the center electrode 165 of the capacitor is high, there is a potential for the formation of a parasitic transistor, with electrode 165 as the gate, collar 125 as the gate dielectric, buried plate 40 as one electrode and buried strap 132 as the other electrode.

The high-k dielectrics, in particular AL2O3, also have the advantage that they trap a large quantity of fixed negative charge and therefore raise the threshold of forming parasitic vertical transistors in the substrate, with the buried plate as one electrode and the buried strap as the other.

Figure 7:
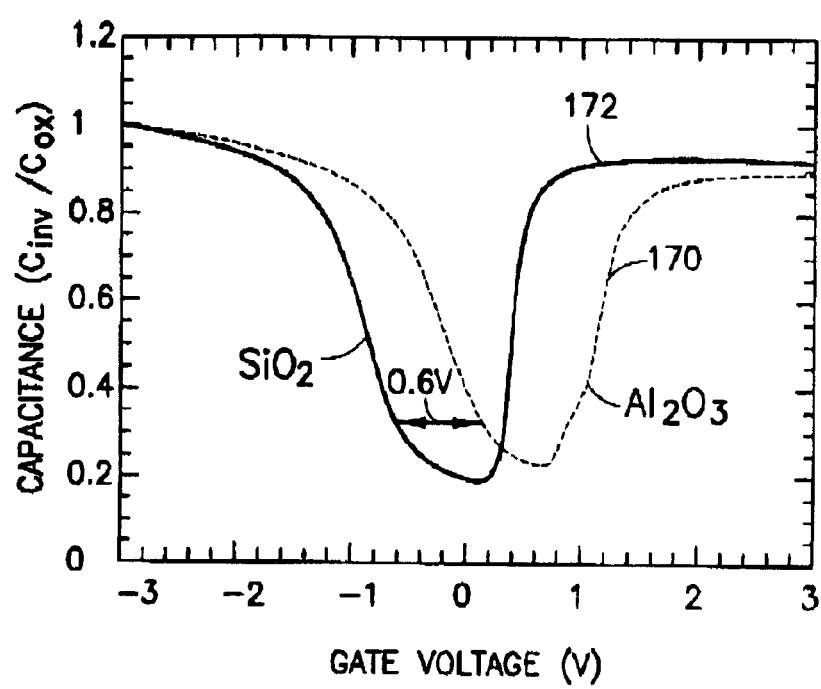
FIG. 7 illustrates a C-V curve shown the improvement in Vt provided by the alternative material.

FIG. 7 shows a C-V curve with the results of a parasitic transistor based on a conventional oxide collar in curve 172 and a high-k collar (Al2O3) in curve 170. The high-k curve has shifted to the right, indicating a higher threshold (by 0.6V) for the formation of parasitic transistors.

An optional feature of the invention is the use of a bottle etch step before the collar formation step.

Another optional feature of the invention is the use of an ALD collar put down as a preliminary step in forming a high-k collar.

While the invention has been described in terms of a single preferred embodiment, those skilled in the art will recognize that the invention can be practiced in various versions within the spirit and scope of the following claims.

What is claimed is:

1. A method of forming a trench capacitor in a substrate comprising the steps of:
   etching a trench having substantially vertical sidewalls;
   depositing by a spin-on process a thermally stable filler material having a molecular weight of greater than 1,000 in the trench;
   annealing the filler material in an oxidizing ambient;
   recessing the filler material down to a capacitor top level;
   forming insulating spacers on the trench sidewalls above the capacitor top level;
   stripping the filler material;
   doping the trench sidewalls below the spacers; and
   depositing a conductive electrode within the trench.

2. A method according to claim 1 in which the thermally stable filler material is deposited in direct contact with the sidewalls.

3. A method according to claim 2, in which the step of forming the spacers is performed by depositing high-k material.

4. A method according to claim 1, in which the step of forming the spacers is performed by depositing high-k material.

5. A method according to claim 1, in which a step of performing a bottle etch precedes the step of depositing a thermally stable filling material.

6. A method according to claim 1, in which the step of annealing the filler material is performed at a temperature of less than 800C and the step of forming the spacers is performed by low pressure deposition of nitride or oxide at a temperature of less than 800C.

7. A method according to claim 6, in which a step of performing a bottle etch precedes the step of depositing a thermally stable filling material.

8. A method of forming a trench capacitor in a substrate comprising the steps of:
   etching a trench having substantially vertical sidewalls:
   depositing a thermally stable filler material in the trench:
   annealing the filler material in an oxidizing ambient;
   recessing the filler material down to a capacitor top level;
   forming insulating spacers on the trench sidewalls above the capacitor top level;
   stripping the filler material;
   doping the trench sidewalls below the spacers; and
   depositing a conductive electrode within the trench, in which the step of annealing the filler material is performed at a temperature of less than 500C; and the step of forming the spacers is performed by atomic layer deposition.

9. A method according to claim 8, in which the step of annealing the filler material is performed in-situ on a spin-on track during the step of trench filling with a thermally stable filler material.

10. A method according to claim 8, in which the step of forming the spacers is performed by depositing high-k material.

11. A method according to claim 10, in which the step of forming the spacers is performed by depositing a material selected from the group comprising Al2O3, HfO2, ZrO2 and La2O3 and their silicates.

12. A method of forming a trench capacitor in a substrate comprising the steps of:
   etching a trench having substantially vertical sidewalls;
   depositing a thermally stable filler material in the trench;
   annealing the filler material in an oxidizing ambient;
   recessing the filler material down to a capacitor top level;
   forming insulating spacers on the trench sidewalls above the capacitor top level;
   stripping the filler material;
   doping the trench sidewalls below the spacers; and
   depositing a conductive electrode within the trench, in which the step of forming the spacers is performed by depositing a high-k material selected from the group comprising Al2O3, HfO2, ZrO2 and La2O3 and their silicates.

13. A method of forming a trench capacitor in a substrate comprising the steps of:
   etching a trench having substantially vertical sidewalls;
   depositing a thermally stable filler material in the trench and in direct contact with the sidewalls;
   annealing the filler material in an oxidizing ambient;
   recessing the filler material down to a capacitor top level;
   forming insulating spacers on the trench sidewalls above the capacitor top level;
   stripping the filler material;
   doping the trench sidewalls below the spacers; and
   depositing a conductive electrode within the trench, in which the step of forming the spacers is performed by depositing a high-k material selected from the group comprising Al2O3, HfO2, ZrO2 and La2O3 and their silicates.

14. A method of forming an integrated circuit containing a DRAM array comprising the steps of:
   a) forming a capacitor by:
   etching at least one trench having substantially vertical sidewalls;
   depositing by a spin-on process a thermally stable filler material having a molecular weight greater than 1,000 in the at least one trench;
   heating the filler material in an oxidizing ambient;
   recessing the filler material down to a capacitor top level;
   forming spacers on the trench sidewalls;
   stripping the filler material;
   doping the trench sidewalls below the spacers; and
   depositing a conductive electrode within the trench;
   b) forming a transistor connecting a bitline to the conductive electrode; and
   completing the integrated circuit.

15. A method according to claim 14, in which the thermally stable filler material is deposited in direct contact with the sidewalls.

16. A method of forming an integrated circuit containing a DRAM array comprising the steps of:
   a) forming a capacitor by:
   etching at least one trench having substantially vertical sidewalls;
   depositing a thermally stable filler material in the at least one trench;
   heating the filler material in an oxidizing ambient;
   recessing the filler material down to a capacitor top level;
   forming spacers on the trench sidewalls;
   stripping the filler material;
   doping the trench sidewalls below the spacers; and
   depositing a conductive electrode within the trench;

b) forming a transistor connecting a bitline to the conductive electrode; and completing the integrated circuit, in which the step of annealing the filler material is performed at a temperature of less than 500C; and the step of forming the spacers is performed by atomic layer deposition.

17. A method according to claim 16, in which the step of heating the filler material is performed in-situ on a spin-on track during the step of trench filling with a thermally stable filling material.

18. A method according to claim 17, in which the step of forming the spacers is performed by depositing high-k material.

19. A method according to claim 18, in which the step of forming the spacers is performed by depositing a material selected from the group comprising Al2O3, HfO2, ZrO2 and La2O3 and their silicates.

20. A method according to claim 16, in which the step of forming the spacers is performed by depositing high-k material.

* * * * *